United States Patent
Jeong et al.

(10) Patent No.: US 10,056,491 B2
(45) Date of Patent: Aug. 21, 2018

(54) SEMICONDUCTOR DEVICES INCLUDING GATE DIELECTRIC STRUCTURES

(71) Applicant: Samsung Electronics Co., Ltd., Suwon-si, Gyeonggi-do (KR)

(72) Inventors: Seong Hoon Jeong, Seongnam-si (KR); Hong Bum Park, Seoul (KR); HanMei Choi, Seoul (KR); Jae Young Park, Yongin-si (KR); Seung Hyun Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/420,512

(22) Filed: Jan. 31, 2017

(65) Prior Publication Data
US 2017/0358680 A1    Dec. 14, 2017

(30) Foreign Application Priority Data
Jun. 13, 2016    (KR) .................. 10-2016-0073138

(51) Int. Cl.
*H01L 29/78*    (2006.01)
*H01L 29/06*    (2006.01)
(Continued)

(52) U.S. Cl.
CPC .... *H01L 29/7854* (2013.01); *H01L 21/28158* (2013.01); *H01L 21/823431* (2013.01); *H01L 21/823462* (2013.01); *H01L 27/0886* (2013.01); *H01L 29/0657* (2013.01); *H01L 29/408* (2013.01); *H01L 29/42364* (2013.01);
(Continued)

(58) Field of Classification Search
CPC ............. H01L 29/7854; H01L 29/0657; H01L 29/408; H01L 29/42364; H01L 29/513; H01L 29/7851; H01L 29/66795; H01L 29/785; H01L 29/41791; H01L 2029/7858; H01L 27/0886; H01L 27/0924; H01L 27/10826; H01L 27/10879; H01L 29/7853
See application file for complete search history.

(56) References Cited

U.S. PATENT DOCUMENTS 7,476,578 B1    1/2009 Cheng et al.
7,564,105 B2 *  7/2009 Chi .................. H01L 29/66795
                                             257/401
(Continued)

FOREIGN PATENT DOCUMENTS

KR    10-0596508 B1    6/2006

*Primary Examiner* — Ida M Soward
(74) *Attorney, Agent, or Firm* — Ward and Smith, P.A.

(57) ABSTRACT

A semiconductor device is provided including a fin active region on a substrate. The fin active region includes a lower region, a middle region, and an upper region. The middle region has lateral surfaces with a slope less steep than the lateral surfaces of the upper region. An isolation region is on a lateral surface of the lower region of the fin active region. A gate electrode structure is provided. A gate dielectric structure having an oxidation oxide layer and a deposition oxide layer, while having a thickness greater than half a width of the upper region of the fin active region is provided. The deposition oxide layer is between the gate electrode structure and the fin active region and the gate electrode structure and the isolation region, and the oxidation oxide layer is between the fin active region and the deposition oxide layer.

15 Claims, 31 Drawing Sheets

(51) Int. Cl.
    *H01L 29/40*     (2006.01)
    *H01L 29/51*     (2006.01)
    *H01L 29/66*     (2006.01)
    *H01L 29/41*     (2006.01)
    *H01L 27/08*     (2006.01)
    *H01L 27/10*     (2006.01)
    *H01L 21/28*     (2006.01)
    *H01L 21/8234*     (2006.01)
    *H01L 27/088*     (2006.01)
    *H01L 29/423*     (2006.01)

(52) U.S. Cl.
    CPC ........ H01L 29/513 (2013.01); H01L 29/7851 (2013.01); H01L 29/7853 (2013.01)

(56) References Cited

U.S. PATENT DOCUMENTS

| | | | |
|---|---|---|---|
| 7,692,251 B2* | 4/2010 | Chung | H01L 21/823412 257/330 |
| 7,910,453 B2* | 3/2011 | Xu | H01L 27/11568 257/374 |
| 7,955,913 B2* | 6/2011 | Kim | H01L 29/7853 257/E21.629 |
| 8,034,714 B2 | 10/2011 | Hwang | |
| 9,165,934 B2 | 10/2015 | Choi et al. | |
| 9,362,386 B2* | 6/2016 | Huang | H01L 29/66977 |
| 9,543,418 B2* | 1/2017 | Ching | H01L 29/785 |
| 9,601,628 B2* | 3/2017 | You | H01L 29/7853 |
| 9,620,406 B2* | 4/2017 | You | H01L 29/6681 |
| 9,711,504 B2* | 7/2017 | You | H01L 27/0886 |
| 9,865,495 B2* | 1/2018 | Kim | H01L 21/76229 |
| 2004/0046200 A1 | 3/2004 | Wu | |
| 2011/0012090 A1 | 1/2011 | Singh et al. | |
| 2013/0045600 A1* | 2/2013 | Lin | H01L 29/7854 438/694 |
| 2014/0361336 A1* | 12/2014 | Chen | H01L 29/785 257/190 |
| 2015/0228731 A1* | 8/2015 | Hsiao | H01L 29/36 257/401 |
| 2015/0270401 A1* | 9/2015 | Huang | H01L 29/7851 257/192 |
| 2015/0287829 A1* | 10/2015 | Kim | H01L 29/42392 257/401 |
| 2015/0364592 A1 | 12/2015 | van Dal et al. | |
| 2016/0260715 A1* | 9/2016 | Chung | H01L 27/0886 |
| 2016/0260719 A1* | 9/2016 | Chung | H01L 27/1104 |
| 2016/0276341 A1* | 9/2016 | You | H01L 27/0886 |
| 2016/0293598 A1* | 10/2016 | Kim | H01L 27/0886 |
| 2017/0005014 A1* | 1/2017 | Yamashita | H01L 22/12 |
| 2017/0077095 A1* | 3/2017 | Lu | H01L 21/2652 |
| 2017/0084616 A1* | 3/2017 | Kim | H01L 27/1104 |
| 2017/0162670 A1* | 6/2017 | You | H01L 29/66545 |
| 2017/0194324 A1* | 7/2017 | You | H01L 27/0886 |

* cited by examiner

SEMICONDUCTOR DEVICES INCLUDING GATE DIELECTRIC STRUCTURES

CROSS-REFERENCE TO RELATED APPLICATION

This application claims benefit of and priority to Korean Patent Application No. 10-2016-0073138, filed on Jun. 13, 2016 in the Korean Intellectual Property Office, the disclosure of which is incorporated herein by reference as if set forth in its entirety.

FIELD

The present inventive concept relates generally to semiconductor devices and, in particular, to semiconductor devices including a gate dielectric structure and related methods.

BACKGROUND

As semiconductor devices have become more highly integrated, the size of FinFET devices has been gradually reduced. In a FinFET device having a reduced size, it may be difficult to form a gate dielectric having reliability.

SUMMARY

Some embodiments of the present inventive concept provide a semiconductor device including a gate dielectric structure for improving reliability.

Further embodiments of the present inventive concept provide methods of forming a semiconductor device including a gate dielectric structure for improving reliability.

Still further embodiments of the present inventive concept may provide an electronic system including a semiconductor device.

Some embodiments of the present inventive concept provide a semiconductor device including a fin active region disposed on a substrate. The fin active region may include a lower region, a middle region provided on the lower region, and an upper region provided on the middle region, and the middle region may have lateral surfaces having a more gentle incline than lateral surfaces of the upper region. An isolation region may be formed on a lateral surface of the lower region of the fin active region. A gate electrode structure intersecting the fin active region and extended to the isolation region may be provided. A gate dielectric structure having an oxidation oxide layer and a deposition oxide layer and having a thickness greater than half a width of the upper region of the fin active region may be provided. The deposition oxide layer may be disposed between the gate electrode structure and the fin active region, and between the gate electrode structure and the isolation region, and the oxidation oxide layer may be disposed between the fin active region and the deposition oxide layer.

Further embodiments of the present inventive concept provide semiconductor devices including a first isolation region provided on a substrate; a first fin active region passing through the first isolation region and protruding from the isolation region; and a first gate structure traversing the first fin active region and extended to the first isolation region. The first gate structure may include a first gate dielectric structure and a first gate electrode structure provided on the first gate dielectric structure, the first gate dielectric structure may include an oxidation oxide layer and a first deposition oxide layer formed of a high-k dielectric having a dielectric constant greater than that of the oxidation oxide layer, the first deposition oxide layer may be interposed between the first gate electrode structure and the first fin active region and between the first gate electrode structure and the first isolation region to be extended to a lateral surface of the first gate electrode structure, the oxidation oxide layer may be interposed between the first deposition oxide layer and the first fin active region, without being extended to a lateral surface of the first gate electrode structure, and the first oxidation oxide layer may be thicker than the first deposition oxide layer.

Still further embodiments of the present inventive concept provide semiconductor devices a fin active region on a substrate, the fin active region including a lower region, a middle region on the lower region, and an upper region on the middle region; an isolation region on a lateral surface of the lower region of the fin active region; and a gate dielectric structure including an oxidation oxide layer and a deposition oxide layer and having a thickness greater than half a width of the upper region of the fin active region. The deposition oxide layer is between a gate electrode structure and the fin active region and between the gate electrode structure and the isolation region. The oxidation oxide layer is between the fin active region and the deposition oxide layer.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Figure 1:
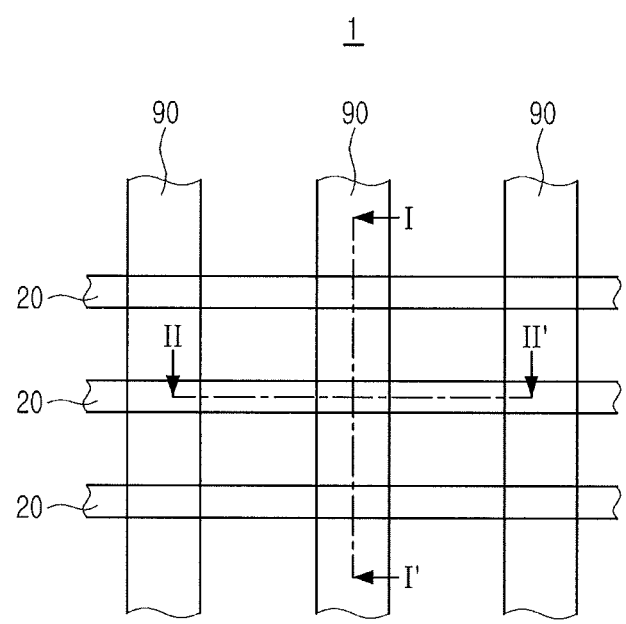
FIG. 1 is a plan view illustrating semiconductor devices according to some embodiments of the present inventive concept.

Hereinafter, the inventive concept will be described in detail by explaining example embodiments of the invention with reference to the attached drawings. Like reference numerals in the drawings denote like elements and, thus, detailed descriptions thereof will be omitted in the interest of brevity.

The inventive concept may be embodied in many different forms and should not be construed as limited to the example embodiments set forth herein. Rather, these embodiments are provided so that this disclosure will be thorough and complete, and will fully convey the scope of the inventive concept to those skilled in the art. In the drawings, lengths and sizes of layers and regions may be exaggerated for clarity.

Furthermore, though terms like 'first' and 'second' are used to describe various elements, components, regions, layers, and/or portions in various embodiments of the inventive concept, the elements, components, regions, layers, and/or portions should not be limited by these terms. These terms are only used to distinguish one element, component, region, layer, or portion from another. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment can be embodied in a different manner, a specified process order may be performed in a different manner. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. As used herein, the term "and/or" includes any and all combinations of one or more of the associated listed items. Expressions such as "at least one of," when preceding a list of elements, modify the entire list of elements and do not modify the individual elements of the list. A terminology such as "substrate" may denote a substrate itself, or a stack structure including a substrate and predetermined layers or films formed on a surface of the substrate. In addition, a terminology "surface of substrate" may denote an exposed surface of the substrate itself, or an external surface of a predetermined layer or a film formed on the substrate.

FIG. 1 is a plan view illustrating a semiconductor device according to some embodiments of the present inventive concept. FIGS. 2A, 2B, 2C, 3A, 3B, 4A, 4B, 5A, and 5B are drawings illustrating semiconductor devices according to some embodiments. In FIGS. 2A to 5B, FIGS. 2A, 3A, 4A, and 5A are cross-sections illustrating a region taken along line I-I' in FIG. 1, and a region taken along line II-II' in FIG. 1, while FIGS. 2B, 3B, 4B, and 5B are partially-enlarged views illustrating portion "A" in FIGS. 2A, 3A, 4A, and 5A, and FIG. 2C is a partially-enlarged view illustrating a partial component of portion "A" in FIG. 2A.

First, a semiconductor device 1 according to some embodiments illustrated with reference to FIGS. 1, 2A, 2B, and 2C, will be discussed. As illustrated in FIGS. 1, 2A, 2B, and 2C, a substrate 5 may be provided. The substrate 5 may be a semiconductor substrate, which may be formed of a semiconductor material such as silicon, or the like.

An isolation region 25 and a fin active region 20 may be disposed on the substrate 5. The isolation region 25 may be formed of an insulating material with which a trench 10 is partially filled.

The fin active region 20 may have a line shape. The fin active region 20 may be provided as a plurality of fin active regions.

The fin active region 20 may include a lower region LR, a middle region MR provided on the lower region LR, and an upper region UR provided on the middle region MR. A width Wb of the middle region MR may be greater than a width Wa of the upper region UR, and may be less than a width Wc of the lower region LR. The middle region MR may have lateral surfaces having a more gentle incline than lateral surfaces of the upper region UR. In other words, the slope of the lateral surfaces of the middle region MR is not as steep as that of the lateral surfaces of the upper region UR.

The upper region UR may have lateral surfaces opposing each other and being substantially parallel to each other, and the middle region MR may have lateral surfaces opposing each other, while not being parallel to each other. The lateral surfaces of the upper region UR, parallel to each other, may be perpendicular to the substrate 5, and the lateral surfaces of the middle region MR, not parallel to each other may have a more gentle incline than the lateral surfaces of the upper region UR, parallel to each other. The middle region MR may have the lateral surfaces having a more gentle incline than the lateral surfaces of the lower region LR. The middle region MR has a width, which may be increased in a direction toward the substrate 5.

The middle region MR of the fin active region 20 may include a first portion Pa adjacent or close to the upper region UR, and a second portion Pb adjacent or close to the lower region LR.

The fin active region 20 may include a body portion 13 passing through the isolation region 25 and a protruding portion 16 protruding from the isolation region 25. The body portion 13 may include the second portion Pb of the middle region MR and the lower region LR, and the protruding portion 16 may include the first portion Pa of the middle region MR and the upper region UR. The isolation region 25 may be formed on a lateral surface of the lower region LR and a lateral surface of the second portion Pb of the middle region MR, of the fin active region 20.

A gate structure 90 may be disposed on the fin active region 20 and the isolation region 25. The gate structure 90 may intersect the fin active region 20 and may be extended to the isolation region 25. The gate structure 90 may have a line shape extended in a direction perpendicular to the fin active region 20.

The impurity regions 60 having conductivity different from that of the fin active region 20 may be disposed within the fin active regions 20 on both sides of the gate structure 90. The impurity regions 60 may be source/drain regions. The impurity regions 60 may be formed of selective epitaxial growth (SEG) patterns formed on recesses 58 in the fin active regions 20 on both sides of the gate structure 90. The protruding portion 16 of the fin active region 20, the impurity regions 60, and the gate structure 90 may form a FinFET device.

Interlayer insulating layers 65 may be disposed on both sides of the gate structure 90, and insulating spacers 55 may be disposed between the interlayer insulating layer 65 and the gate structure 90.

The gate structure 90 may include a gate dielectric structure 80 and a gate electrode structure 85 on the gate dielectric structure 80. The gate electrode structure 85 may be formed of metal nitride and/or a metallic material.

The gate dielectric structure 80 may include an oxidation oxide layer 45 and a deposition oxide layer 75. As used herein, the term "oxidation oxide layer" refers to a layer that is formed using oxidation and a "deposition oxide layer" refers to a layer that is formed using a deposition process.

The deposition oxide layer 75 may be disposed between the gate electrode structure 85 and the fin active region 20 and between the gate electrode structure 85 and the isolation region 25 to be extended to a lateral surface of the gate electrode structure 85.

The oxidation oxide layer 45 may be disposed between the deposition oxide layer 75 and the fin active region 20, and may be extended between the deposition oxide layer 75 and the isolation region 25. The oxidation oxide layer 45 may not be extended to the lateral surface of the gate electrode structure 85. When the fin active region 20 is provided as a plurality of fin active regions, the oxidation oxide layer 45 may be disposed to be continuously formed between fin active regions 20 adjacent to each other.

The deposition oxide layer 75 may be formed by performing a deposition process, such as an atomic layer deposition (ALD) process, or the like. The deposition oxide layer 75 may be formed of a high-k dielectric having a dielectric constant greater than that of the oxidation oxide layer 45. The deposition oxide layer 75 may be formed of a metal oxide such as a hafnium oxide or an aluminum oxide or the like.

In some embodiments, the first portion Pa of the middle region MR of the fin active region 20 may oppose the oxidation oxide layer 45, and the second portion Pb may oppose the isolation region 25. The first portion Pa may be recessed as compared to the second portion Pb. A dotted line in FIG. 2B illustrates a virtual surface continuing from a lateral surface of the second portion Pb. For example, the dotted line in FIG. 2B may represent a standard depth to which the first portion Pa is recessed, as compared to the second portion Pb. In other words, a distance from the dotted line in FIG. 2B to a surface of the first portion Pa may be a recess depth. A thickness of the oxidation oxide layer 45 may be about three or more times greater than the recess depth to which the first portion Pa is recessed, as compared to the second portion Pb.

In some embodiments, the gate dielectric structure 80 may be thicker than half the width Wa of the upper region UR of the fin active region 20.

In some embodiments, a portion of the oxidation oxide layer 45 opposing the protruding portion 16 of the fin active region 20 may have a thickness T1a greater than half the width Wa of the upper region UR of the fin active region 20.

The thickness T1a of the oxidation oxide layer 45 may be less than the width Wa of the upper region UR of the fin active region 20.

In some embodiments, the thickness T1a of a portion of the oxidation oxide layer 45 opposing the protruding portion 16 may be greater than a thickness T1b of a portion of the oxidation oxide layer 45 opposing the isolation region 25.

In some embodiments, the thicknesses T1a and T1b of the oxidation oxide layer 45 may be greater than a thickness T2 of the deposition oxide layer 75.

The oxidation oxide layer 45 may be formed of a material having a density higher than that of a material of the isolation region 25. For example, the isolation region 25 may be formed of a tonen silazene (TOSZ) oxide or a flowable-CVD (F-CVD) oxide, and the oxidation oxide layer 45 may be formed of an oxidation oxide (an oxidation oxide material) formed by oxidizing a semiconductor material.

In some embodiments, the oxidation oxide layer 45 may include a first oxidation oxide layer 35 and a second oxidation oxide layer 43.

The first oxidation oxide layer 35 may be an oxide formed by oxidizing the fin active region 20 at a first temperature. When the fin active region 20 is formed of silicon, the first oxidation oxide layer 35 may be formed of an oxidation silicon oxide (an oxidation silicon oxide).

The second oxidation oxide layer 43 may be an oxide formed by oxidizing a semiconductor material layer at a second temperature higher than the first temperature. When the semiconductor material layer is formed of silicon, the second oxidation oxide layer 43 may be formed of an oxidation silicon oxide formed at a temperature higher than a formation temperature of the first oxidation oxide layer 35.

The oxidation oxide layer 45 may be directly in contact with the protruding portion 16 of the fin active region 20 to be formed as an oxidation silicon oxide having higher quality than that of an oxide formed in a deposition process. Reliability of the gate dielectric structure 80 including the oxidation oxide layer 45 may be improved. Thus, a FinFET device, which may be configured of the protruding portion 16 of the fin active region 20, the impurity regions 60, and the gate structure 90, may secure high reliability. Thus, reliability of a semiconductor device adopting the FinFET device having higher reliability may be improved.

According some embodiments, the gate dielectric structure 80 may include the oxidation oxide layer 45 including the first oxidation oxide layer 35 and the second oxidation oxide layer 43 formed at a temperature higher than a formation temperature of the first oxidation oxide layer 35, but is not limited thereto. Hereinafter, with reference to FIGS. 3A, 3B, 4A, 4B, 5A, and 5B, examples of the gate dielectric structure 80, for improving reliability, will be discussed.

Figure 3A:
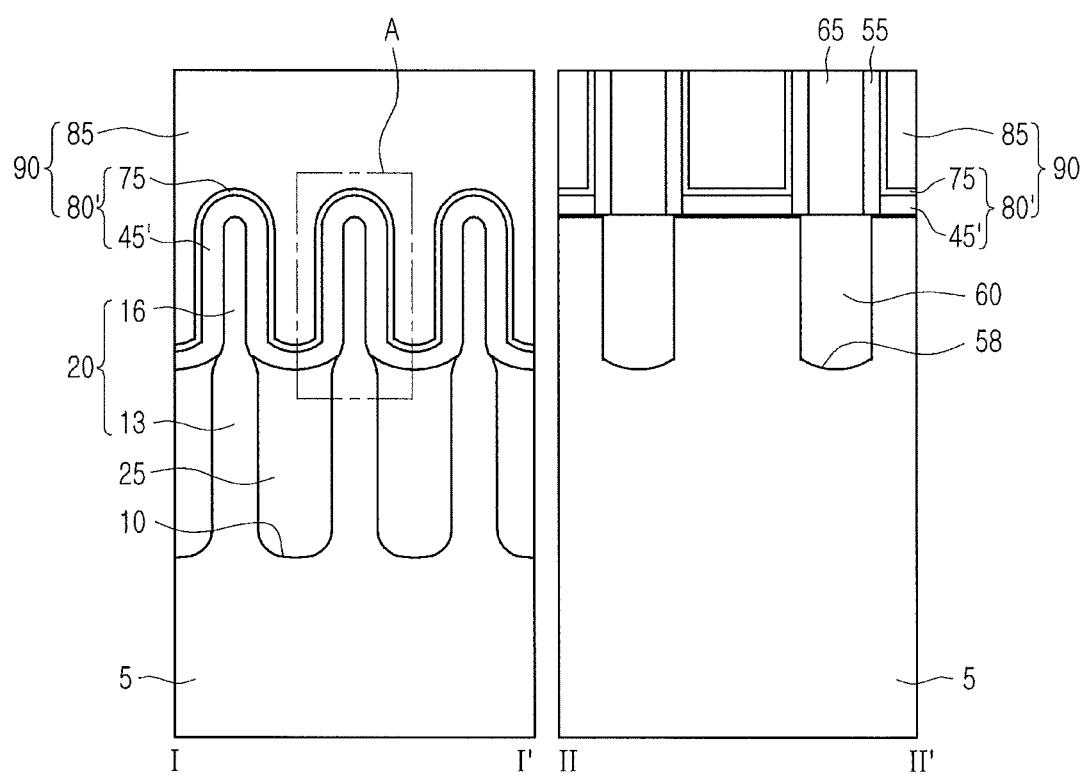
FIGS. 3A and 3B are drawings illustrating semiconductor devices according to some embodiments of the present inventive concept.
Figure 3B:
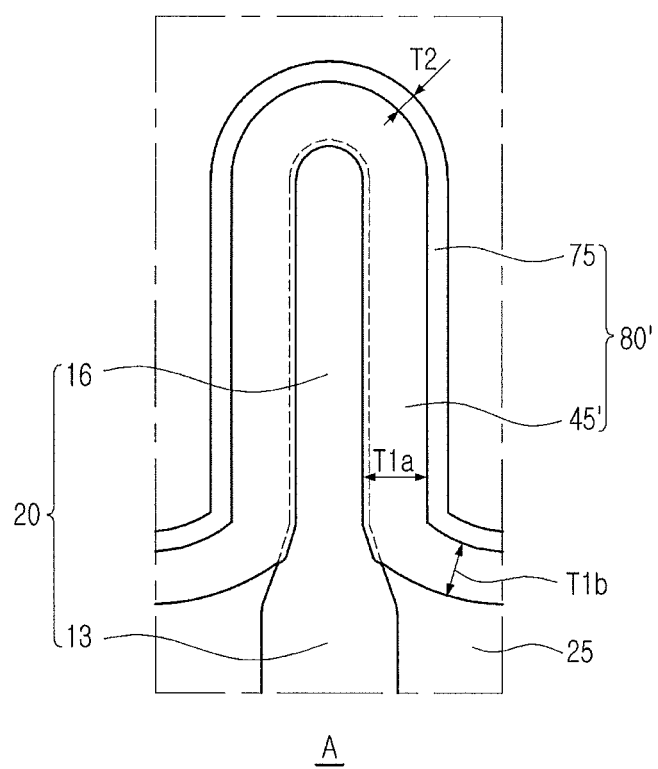

First, with reference to FIGS. 3A and 3B, a modified example of the gate dielectric structure 80 will be discussed. As illustrated in FIGS. 3A and 3B, a gate dielectric structure 80' may include an oxidation oxide layer 45' and a deposition oxide layer 75. The oxidation oxide layer 45' may be in contact with the protruding portion 16 of the fin active region 20 to be formed of a thermal oxidation oxide material extended between the deposition oxide layer 75 and the isolation region 25.

Figure 2A:
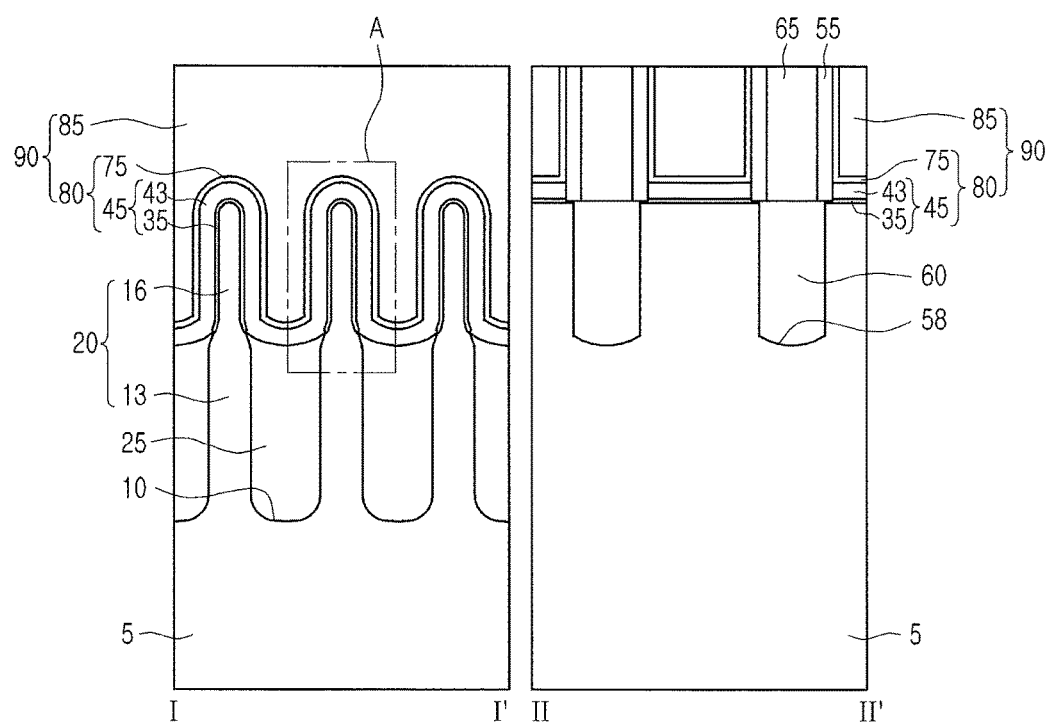
FIGS. 2A, 2B, and 2C are drawings illustrating semiconductor devices according to some embodiments of the present inventive concept.
Figure 2B:
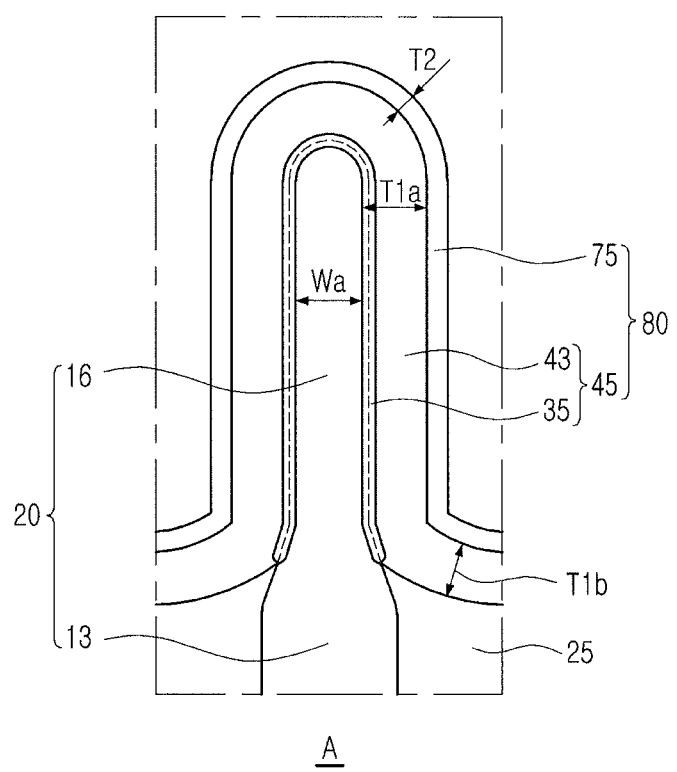

The oxidation oxide layer 45' may be formed to have a thickness substantially the same as that of the oxidation oxide layer 45 illustrated in FIGS. 2A and 2B. The deposition oxide layer 75 may be the same as the deposition oxide layer 75 illustrated in FIGS. 2A and 2B.

Figure 4A:
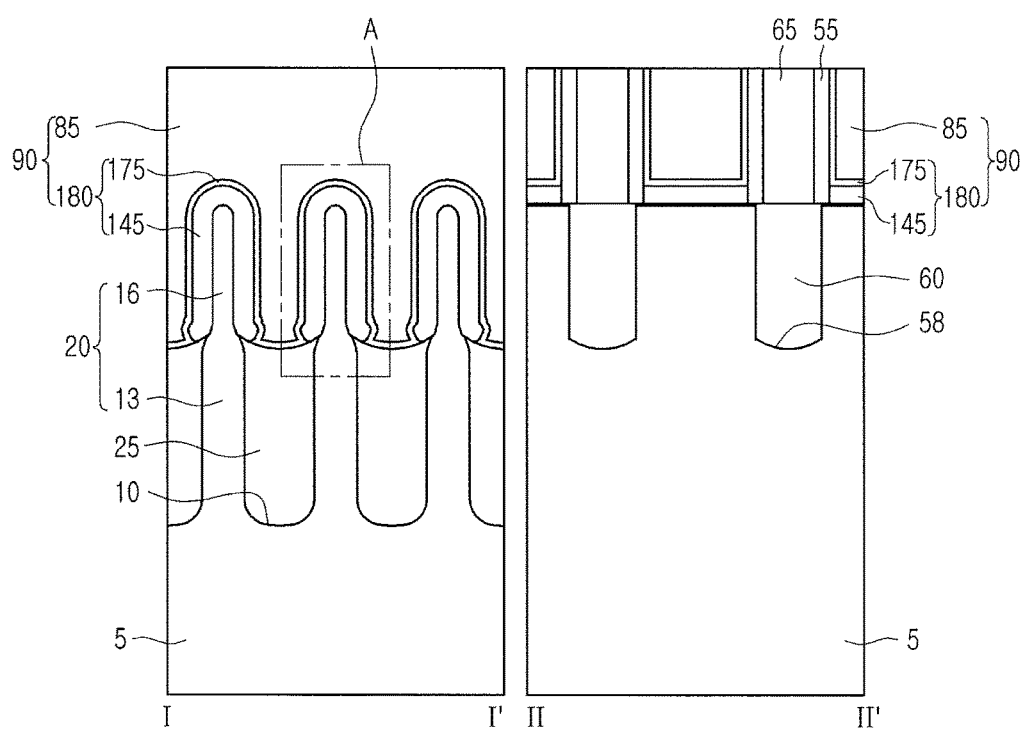
FIGS. 4A and 4B are drawings illustrating semiconductor devices according to some embodiments of the present inventive concept.
Figure 4B:
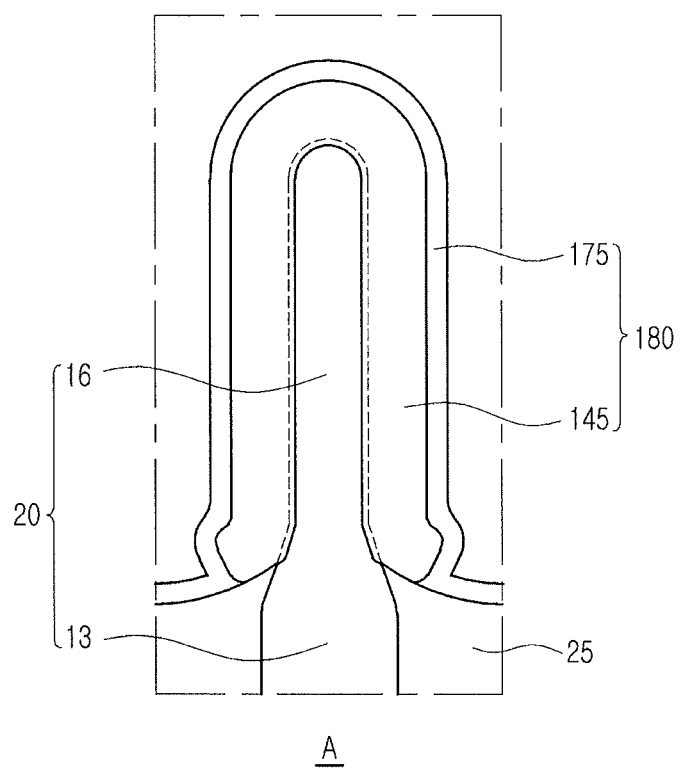

Referring now to FIGS. 4A and 4B, another modified example of the gate dielectric structure 80 will be discussed. As illustrated in FIGS. 4A and 4B, a gate dielectric structure 180 may include an oxidation oxide layer 145 and a deposition oxide layer 175. The oxidation oxide layer 145 may be formed on a surface of the protruding portion 16. The oxidation oxide layer 145 may be formed to have a thickness substantially the same as that of the oxidation oxide layer 45 illustrated in FIGS. 2A and 2B. For example, the oxidation oxide layer 145 may be formed to have a thickness greater than half a width of an upper region of the fin active region 20, in a manner similar to the oxidation oxide layer 45 illustrated in FIGS. 2A and 2B.

The deposition oxide layer 175 may be formed to have a thickness less than that of the oxidation oxide layer 145, and may be extended between the gate electrode structure 85 and the oxidation oxide layer 145 and between the gate electrode structure 85 and the isolation region 25. The deposition oxide layer 175 may be in contact with the isolation region 25.

Figure 2C:
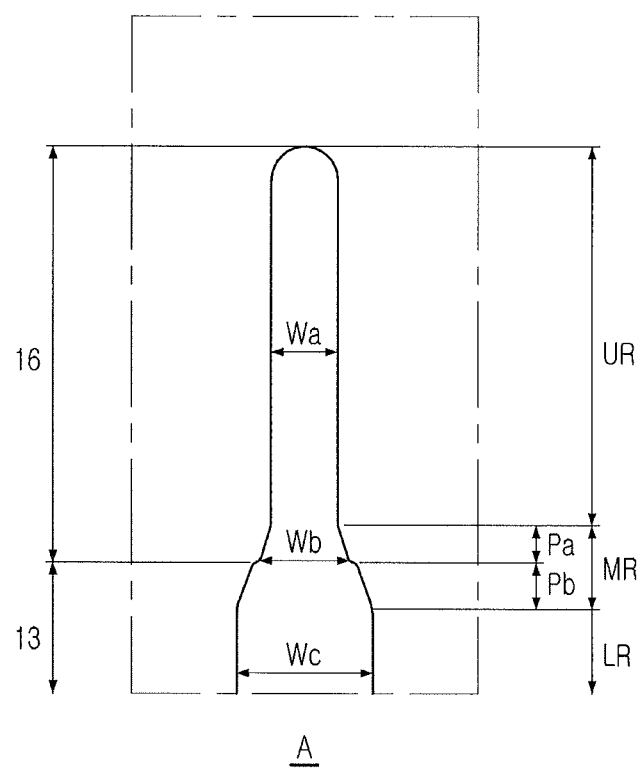
Figure 5A:
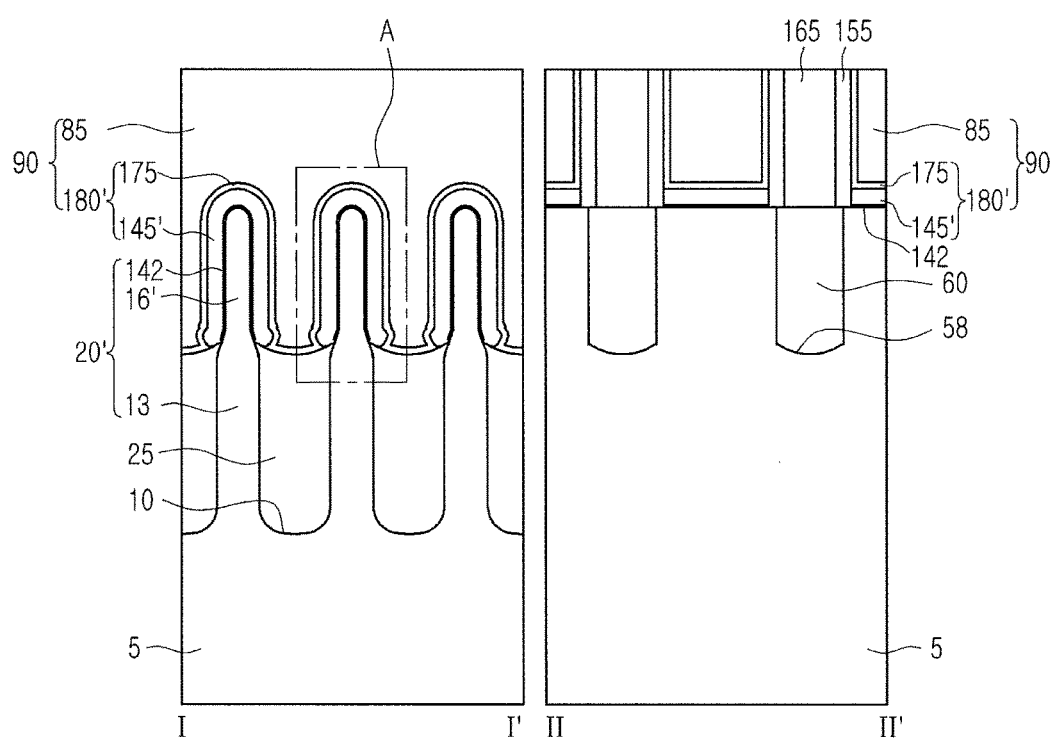
FIGS. 5A and 5B are drawings illustrating semiconductor devices according to some embodiments of the present inventive concept.
Figure 5B:
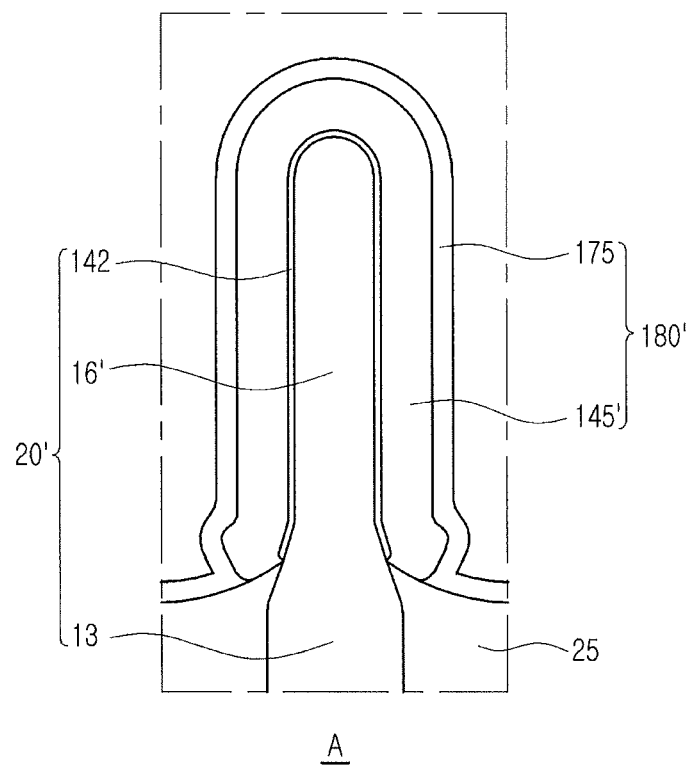

Referring now to FIGS. 5A and 5B, while another modified example of the gate dielectric structure 80 is discussed, a modified example of the fin active region 20 will be discussed. As illustrated in FIGS. 5A and 5B, a fin active region 20' may include the body portion 13, a protruding portion 16', and a buffer epitaxial layer 142. In the fin active region 20', as illustrated in FIGS. 2A, 2B, and 2C, the body portion 13 may be a portion passing through the isolation region 25, and the protruding portion 16' may be a portion disposed on the body portion 13. The buffer epitaxial layer 142 may be disposed on a surface of the protruding portion 16'.

A gate dielectric structure 180' may include an oxidation oxide layer 145' and the deposition oxide layer 175. The oxidation oxide layer 145 may cover the buffer epitaxial layer 142. The deposition oxide layer 175 may be formed to have a thickness less than that of the oxidation oxide layer 145, and may be extended between the gate electrode structure 85 and the oxidation oxide layer 145 and between the gate electrode structure 85 and the isolation region 25. The deposition oxide layer 175 may be in contact with the isolation region 25.

Figure 6:
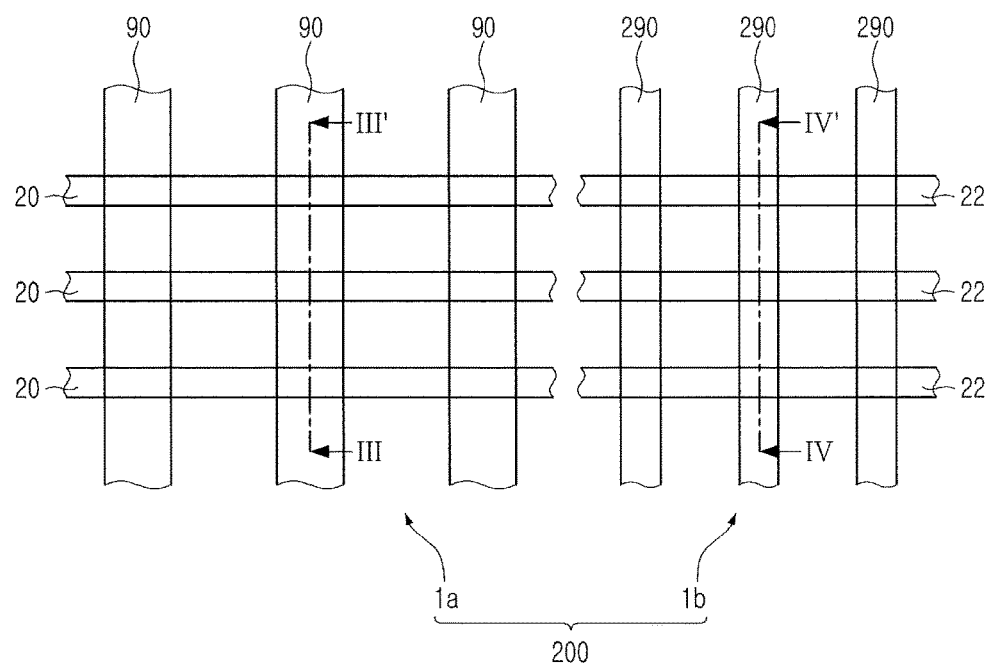
FIG. 6 is a plan view illustrating semiconductor devices according to some embodiments of the present inventive concept.

FIG. 6 is a plan view illustrating a semiconductor device 200 according to some embodiments of the present inventive concept. FIGS. 7, 8, 9, and 10 are cross-sections illustrating examples of the semiconductor device 200 according to some embodiments. FIGS. 7, 8, 9, and 10 are cross-sections illustrating a region taken along line III-III' in FIG. 6, and a region taken along line IV-IV' in FIG. 6.

Figure 7:
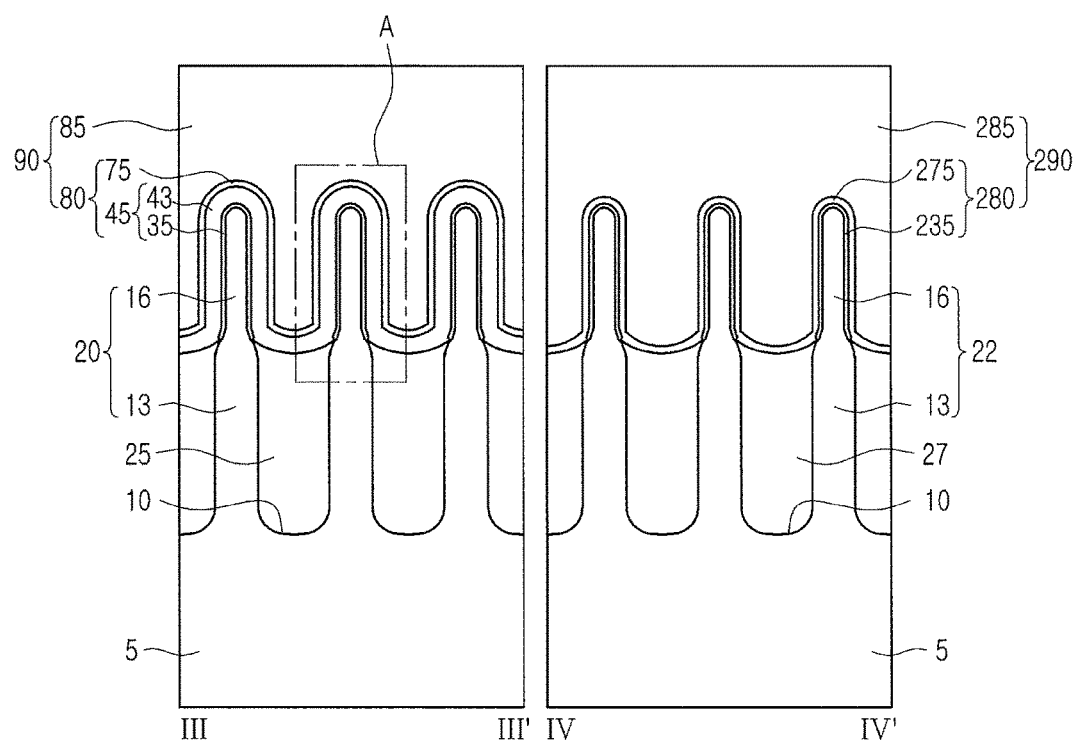
FIG. 7 is a cross-section illustrating semiconductor devices according to some embodiments of the present inventive concept.

First, with reference to FIGS. 6 and 7, an example of the semiconductor device 200 according to another example embodiment will be discussed. As illustrated in FIGS. 6 and 7, the substrate 5 having a first circuit region 1a and a second circuit region 1b may be prepared. The substrate 5 may be a semiconductor substrate formed of a semiconductor material such as silicon, or the like. The first circuit region 1a may be a region including an input/output (I/O) device, and the second circuit region 1b may be a region including a logic device or a memory device such as a Static Random Access Memory (SRAM).

A first fin active region 20 and a first isolation region 25, as illustrated in FIGS. 2A, 2B, and 2C, may be disposed on the substrate 5 of the first circuit region 1a. A second fin active region 22 and a second isolation region 27 may be disposed on the substrate 5 of the second circuit region 1b. Each of the first fin active region 20 and the second fin active region 22 may include the body portion 13 and the protruding portion 16, as illustrated in FIGS. 2A, 2B, and 2C.

A first gate structure 90 traversing the first fin active region 20 and extended to the first isolation region 25, may be disposed on the substrate 5 of the first circuit region 1a. A second gate structure 290 traversing the second fin active region 22 and extended to the second isolation region 27, may be disposed on the substrate 5 of the second circuit region 1b.

The first gate structure 90 may be the same as the gate structure 90 illustrated in FIGS. 1, 2A, and 2B. The first gate structure 90 may include the first gate electrode structure 85 on the first gate dielectric structure 80. The first gate dielectric structure 80 may be the same as the gate dielectric structure 80 illustrated in FIGS. 2A and 2B. For example, the first gate dielectric structure 80 may include an oxidation oxide layer 45 and a first deposition oxide layer 75. The oxidation oxide layer 45 and the first deposition oxide layer 75 may be the same as the oxidation oxide layer 45 and the deposition oxide layer 75 illustrated in FIGS. 2A and 2B. For example, the deposition oxide layer 75 may be disposed between the gate electrode structure 85 and the fin active region 20 and between the gate electrode structure 85 and the isolation region 25 to be extended to a lateral surface of the gate electrode structure 85, and the oxidation oxide layer 45 may be disposed between the deposition oxide layer 75 and the fin active region 20 to be extended between the deposition oxide layer 75 and the isolation region 25, without being extended to a lateral surface of the gate electrode structure 85. As discussed above, the oxidation oxide layer 45 and the first deposition oxide layer 75 may be formed to have the same structure and may be formed of the same material, as that of the oxidation oxide layer 45 and the deposition oxide layer 75 as illustrated in FIGS. 2A and 2B, and thus a detailed description thereof will be omitted.

The second gate structure 290 may include a second gate dielectric structure 280 and a second gate electrode structure 285 provided on the second gate dielectric structure 280. The second gate electrode structure 285 may traverse the second fin active region 22 to be extended to the second isolation region 27. The second gate dielectric structure 280 may include an interfacial oxide layer 235 and a second deposition oxide layer 275. The interfacial oxide layer 235 may be formed to have a thickness less than that of the oxidation oxide layer 45. The second deposition oxide layer 275 may be formed of substantially the same material and/or may be formed to have the same thickness, as that of the first deposition oxide layer 75.

In some embodiments, the first gate dielectric structure 80 disposed on the first circuit region 1a may be the same as the gate dielectric structure 80 illustrated in FIGS. 2A and 2B, but is not limited thereto. The first gate dielectric structure 80 may be variously modified. Modified examples of the first gate dielectric structure 80 will be discussed with reference to FIGS. 8, 9, and 10, respectively.

Figure 8:
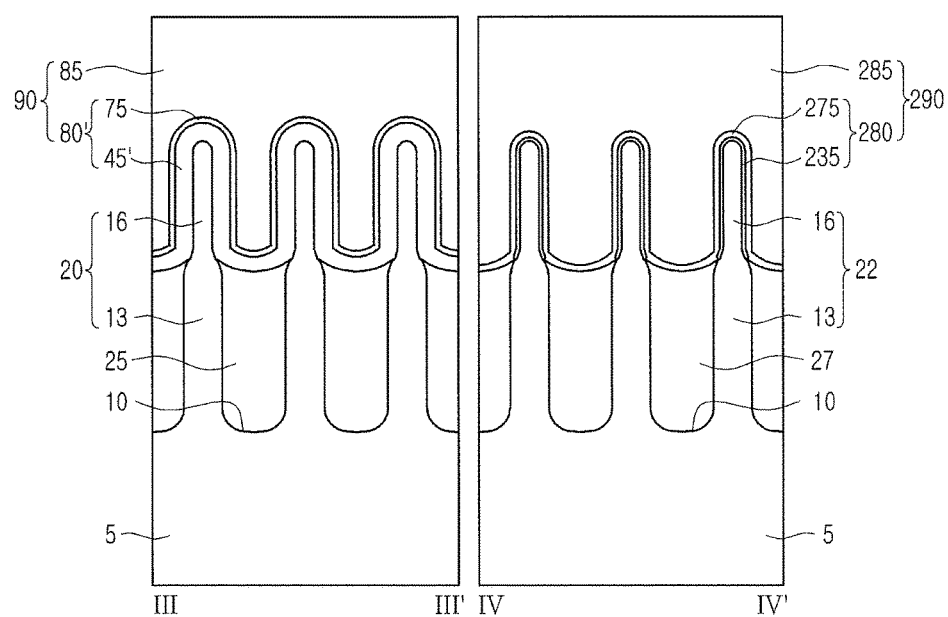
FIG. 8 is a cross-section illustrating semiconductor devices according to some embodiments of the present inventive concept.

With reference to FIG. 8, the gate structure 90 formed on the substrate 5 of the first circuit region 1a may include a first gate dielectric structure 80' the same as the gate dielectric structure 80' illustrated in FIGS. 3A and 3B.

Figure 9:
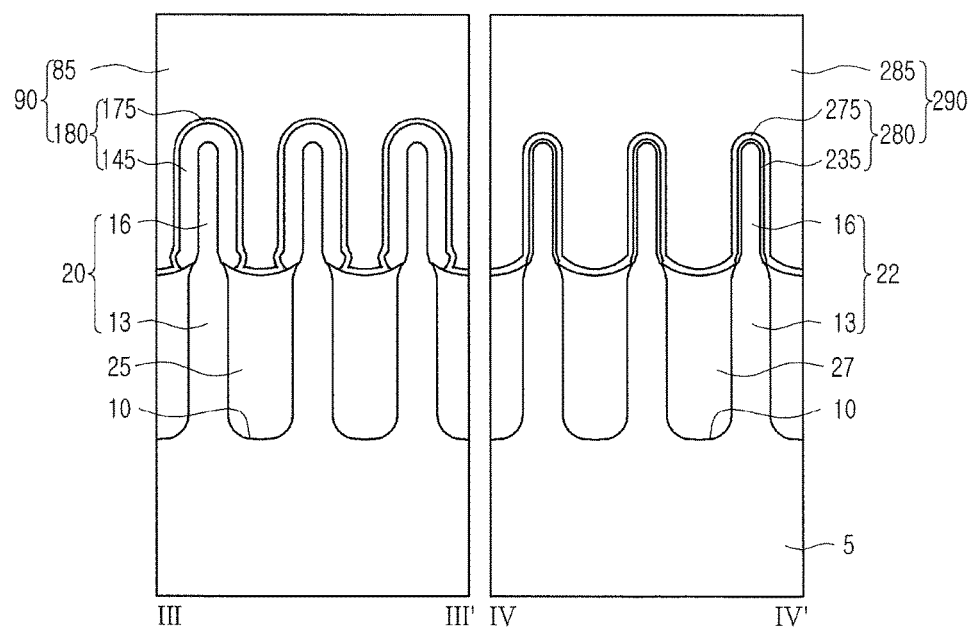
FIG. 9 is a cross-section illustrating semiconductor devices according to some embodiments of the present inventive concept.

With reference to FIG. 9, the gate structure 90 formed on the substrate 5 of the first circuit region 1a may include a first gate dielectric structure 180 the same as the gate dielectric structure 180 illustrated in FIGS. 4A and 4B.

Figure 10:
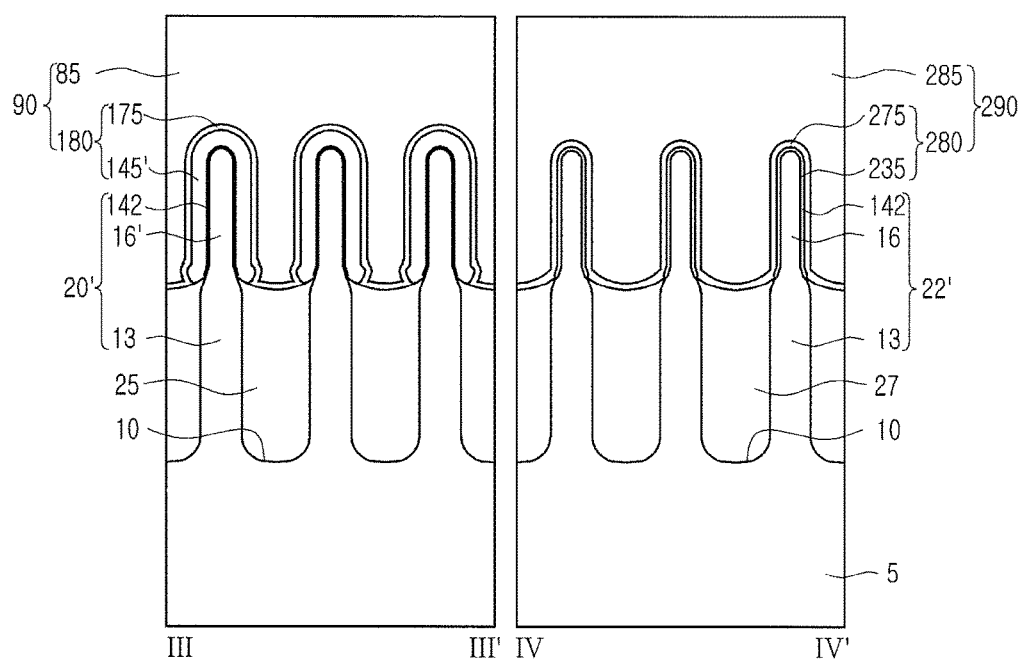
FIG. 10 is a cross-section illustrating semiconductor devices according to some embodiments of the present inventive concept.

With reference to FIG. 10, the gate structure 90 formed on the substrate 5 of the first circuit region 1a may include a first gate dielectric structure 180' the same as the gate dielectric structure 180' illustrated in FIGS. 5A and 5B.

In some embodiments, the first fin active region 20 disposed on the first circuit region 1a and the second fin active region 22 disposed on the second circuit region 1b may be the same as the fin active region 20 illustrated in FIGS. 2A, 2B, and 2C, but are not limited thereto. A modified example of the fin active region will be discussed with reference to FIG. 10.

With reference to FIG. 10, each of the first fin active region 20' disposed on the first circuit region 1a and a second fin active region 22' disposed on the second circuit region 1b, may be the same as the fin active region 20' illustrated in FIGS. 5A and 5B. For example, each of the first fin active region 20' disposed on the first circuit region 1a and the second fin active region 22' disposed on the second circuit region 1b, may include the body portion 13, the protruding portion 16', and the buffer epitaxial layer 142, as illustrated in FIGS. 5A and 5B.

Processing steps in the fabrication of semiconductor devices according to embodiments discussed with reference to FIGS. 1, 2A, 2B, and 2C, will be discussed with reference to FIGS. 11 to 19. FIGS. 11 to 19 are cross-sections illustrating a region taken along line I-I' in FIG. 1 and a region taken along line II-II' in FIG. 1.

Figure 11:
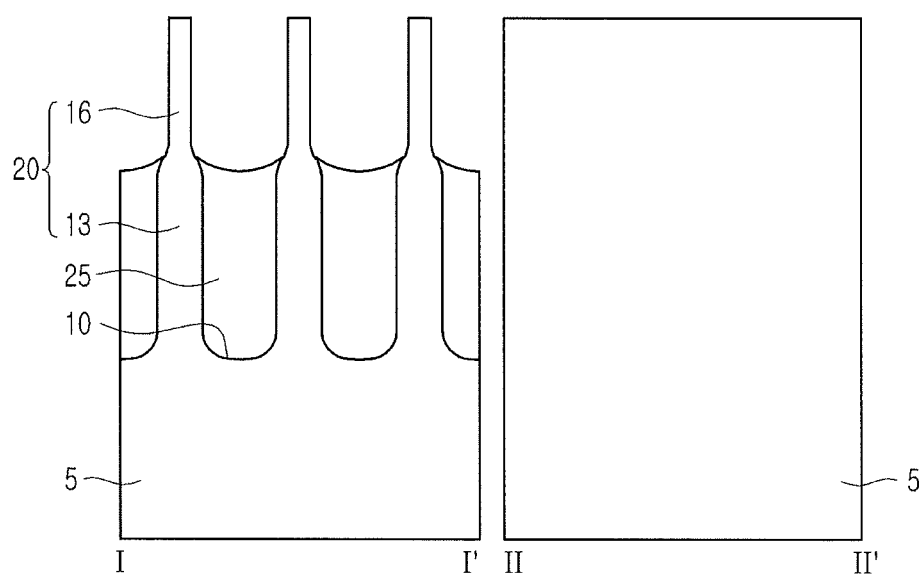
FIGS. 11 to 19 are cross-sections illustrating processing steps in the fabrication of semiconductor devices according to some embodiments of the present inventive concept.

With reference to FIGS. 1 and 11, the substrate 5 may be prepared. The substrate 5 may be a semiconductor substrate, which may be formed of a semiconductor material such as silicon, or the like.

The fin active region 20 may be formed on the substrate 5. Forming the fin active region 20 may include forming trenches 10 by etching the substrate 5.

An isolation region 25 with which the trenches 10 are partially filled may be formed. The isolation region 25 may be formed of an insulating material of silicon oxide series. Forming the isolation region 25 may include forming an insulating material layer on a substrate having the trenches 10, planarizing the insulating material layer, and etching-back the planarized insulating material layer. The insulating material layer may be formed of a tonen silazene (TOSZ) oxide or a flowable-CVD (F-CVD) oxide.

In some embodiments, the fin active region 20 may include a body portion 13 passing through the isolation region 25 and a protruding portion 16 protruding from the isolation region 25.

In some embodiments, in the fin active region 20, the body portion 13 may have a width greater than that of the protruding portion 16.

Figure 12:
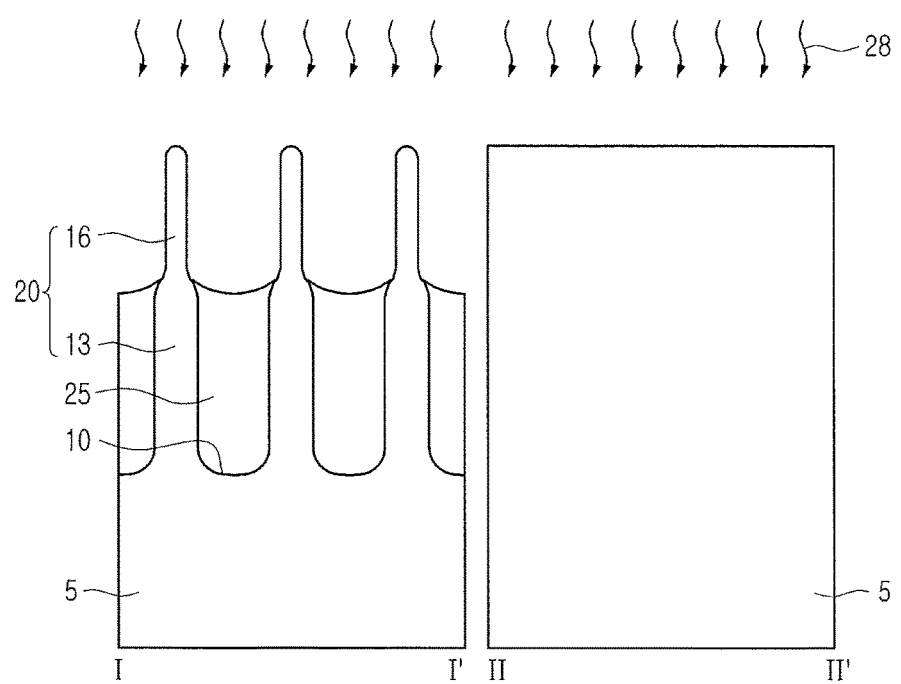

With reference to FIGS. 1 and 12, a surface treatment process 28 may be performed. In a case of the protruding portion 16 of the fin active region 20, surface roughness thereof may be improved by the surface treatment process 28. The surface treatment process 28 may be a plasma process using hydrogen.

In some embodiments, by the surface treatment process 28, an upper portion of the protruding portion 16 of the fin active region 20 may be rounded.

Figure 13:
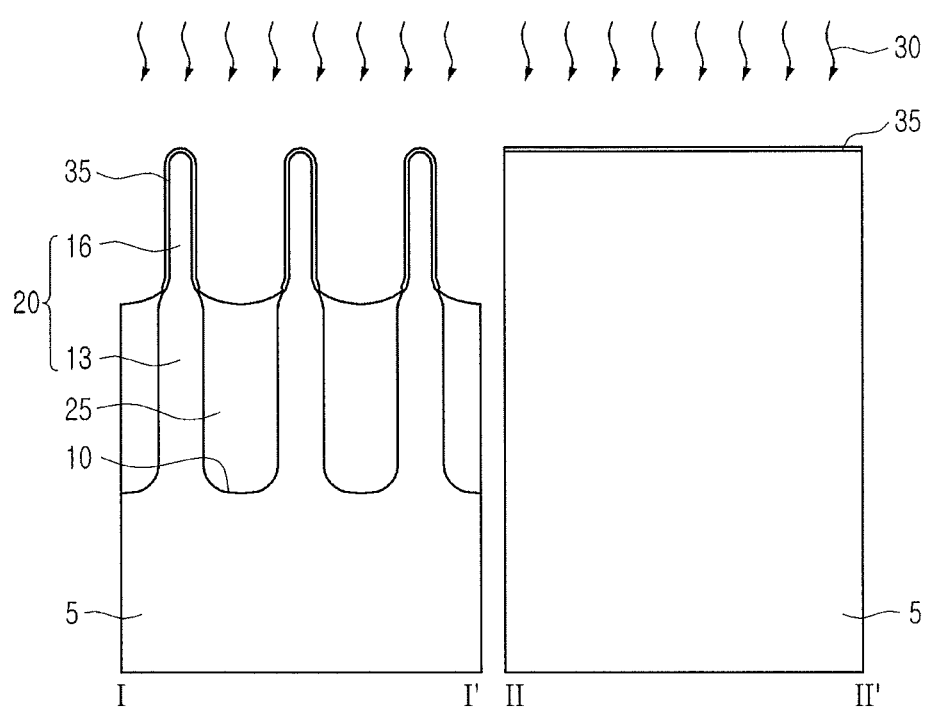

With reference to FIGS. 1 and 13, as a first oxidation process 30 is performed to oxidize an exposed surface of the protruding portion 16 of the fin active region 20 so as to form the first oxidation oxide layer 35. The first oxidation process 30 may be a plasma oxidation process.

The first oxidation oxide layer 35 may be formed of an oxide of a first element as the first element inside the protruding portion 16 of the fin active region 20 reacts with oxygen supplied from an outside source in the first oxidation process 30. For example, when the fin active region 20 is formed of silicon, the first oxidation oxide layer 35 may be formed of an oxidation silicon oxide.

With reference to FIGS. 1 to 14, a semiconductor layer 40 may be formed on a substrate having the first oxidation oxide layer 35. The semiconductor layer 40 may be conformally formed on the substrate having the first oxidation oxide layer 35 using a deposition process such as chemical vapor deposition (CVD), atomic layer deposition (ALD), or the like.

In some embodiments, the semiconductor layer 40 may be formed of a silicon layer.

Figure 14:
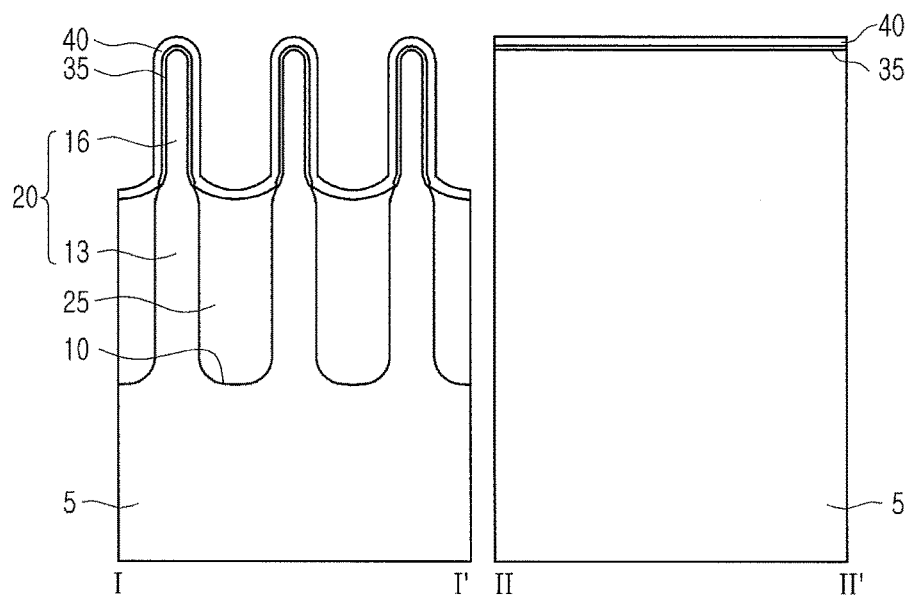
Figure 15:
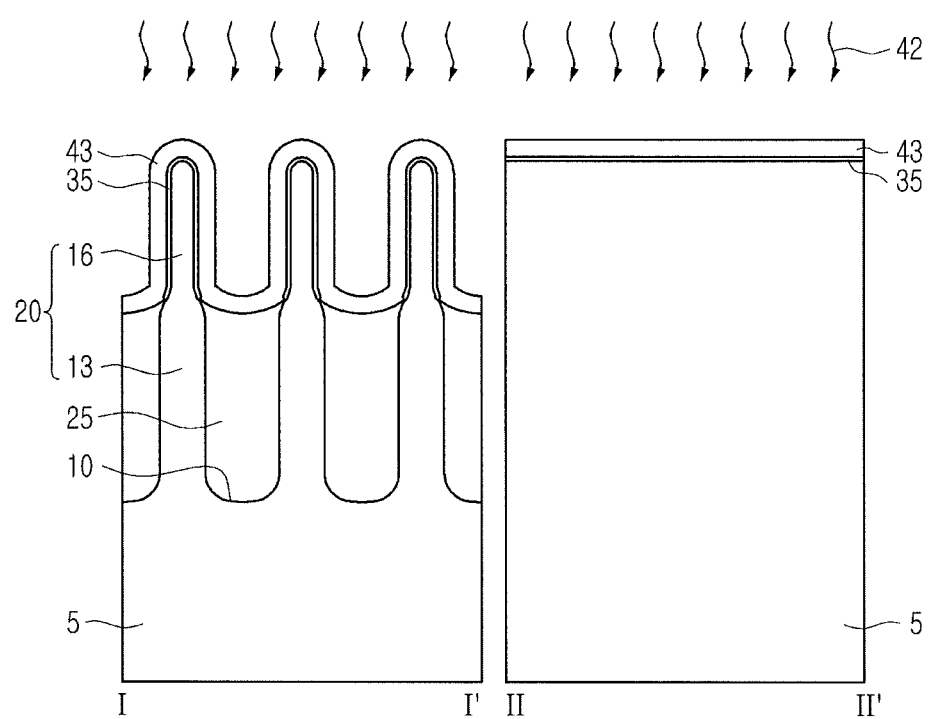

With reference to FIGS. 1 and 15, a second oxidation process 42 is performed to oxidize the semiconductor layer (40 in FIG. 14) so as to form the second oxidation oxide layer 43.

In some embodiments, the entirety of the semiconductor layer (40 in FIG. 14) may be oxidized.

In some embodiments, the second oxidation process 42 may be performed as a thermal oxidation process.

In some embodiments, the first oxidation process (30 in FIG. 13) may be a low temperature process, and the second oxidation process 42 may be a high temperature process. The second oxidation process 42 may be performed at a temperature higher than that of the first oxidation process (30 in FIG. 13). For example, the first oxidation process (30 in FIG. 13) may be performed at a temperature of about 500° C. or less, and the second oxidation process 42 may be performed at a temperature higher than a process temperature of the first oxidation process (30 in FIG. 13), for example, at a temperature of about 800° C. or more. The second oxidation process 42 may be an in-situ steam generation (ISSG) oxidation process performed at a temperature between about 800° C. to about 1050° C.

The second oxidation oxide layer 43 may be formed as an element inside the semiconductor layer (40 in FIG. 14) reacts with oxygen supplied in the second oxidation process 42. For example, when the semiconductor layer 40 is formed of a silicon layer, the second oxidation oxide layer 43 may be formed as a silicon oxidation oxide layer.

The second oxidation oxide layer 43 may be formed without the consumption of a first element inside the protruding portion 16 of the fin active region 20, for example, a silicon element. Thus, while the second oxidation oxide layer 43 is formed to have a desired thickness, a reduction in a width of the protruding portion 16 of the fin active region 20 may be significantly reduced. A thickness of the second oxidation oxide layer 43 may be the same, as illustrated in FIGS. 2A and 2B.

With reference to FIGS. 1 to 16, while patterns 52 are formed on a substrate having the second oxidation oxide layer 43, openings 57 between the patterns 52 may be formed. Each of the patterns 52 may include a preliminary gate pattern 48 and a mask pattern 50, sequentially stacked thereon. Preliminary gate patterns 48 may be formed of a material such as polysilicon, or the like, and mask patterns 50 may be formed of a material such as silicon nitride, or the like. The openings 57 may be overlapped with the fin active region 20.

The insulating spacers 55 may be formed on lateral surfaces of the patterns 52 inside the openings 57. The insulating spacers 55 may be formed of an insulating material such as a silicon oxide, silicon nitride, or the like.

The impurity regions 60 may be formed inside the fin active region 20 in a lower portion of the openings 57. The impurity regions 60 may have conductivity different from that of the fin active region 20. For example, when the fin active region 20 has P-type conductivity, the impurity regions 60 may have N-type conductivity. Alternatively, when the fin active region 20 has N-type conductivity, the impurity regions 60 may have P-type conductivity.

In some embodiments, forming the impurity regions 60 may include forming recesses 58 by etching the fin active region 20 in a lower portion of the openings 57, and forming selective epitaxial growth (SEG) patterns in which an impurity is included in the recesses 58.

Figure 16:
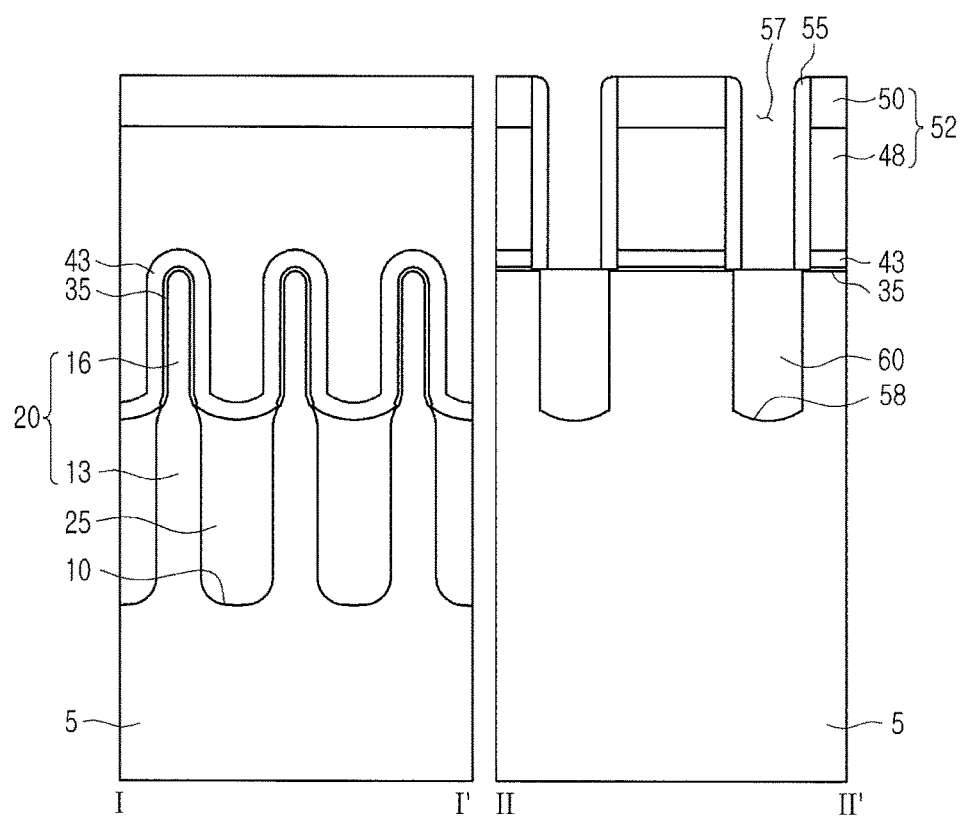
Figure 17:
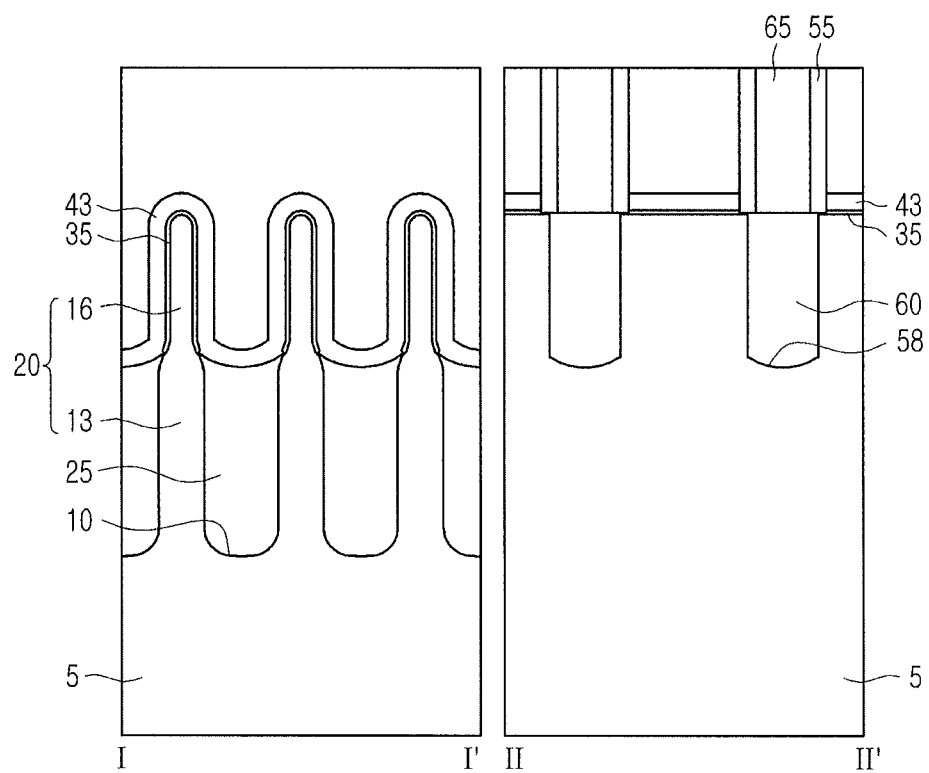

With reference to FIGS. 1 and 17, the interlayer insulating layer 65, with which the openings 57 are filled, may be formed. The interlayer insulating layer 65 may be formed of an insulating material of silicon oxide series. Forming the interlayer insulating layer 65 may include forming an insulating material, with which the openings 57 are filled, on a substrate having the impurity regions 60, and planarizing the insulating material until the preliminary gate patterns 48 is exposed after the mask patterns (50 in FIG. 16) are removed.

Figure 18:
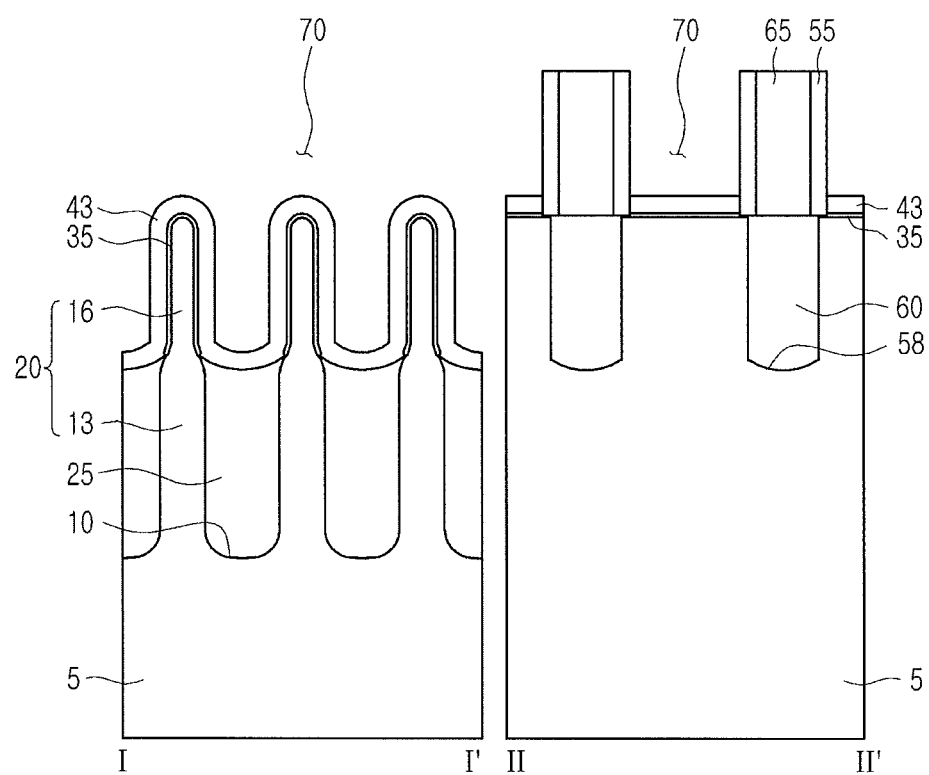

With reference to FIGS. 1 and 18, an etching process is performed to selectively remove the preliminary gate patterns 48 so as to form gate trenches 70. The second oxidation oxide layer 43 may be exposed by the gate trenches 70.

Figure 19:
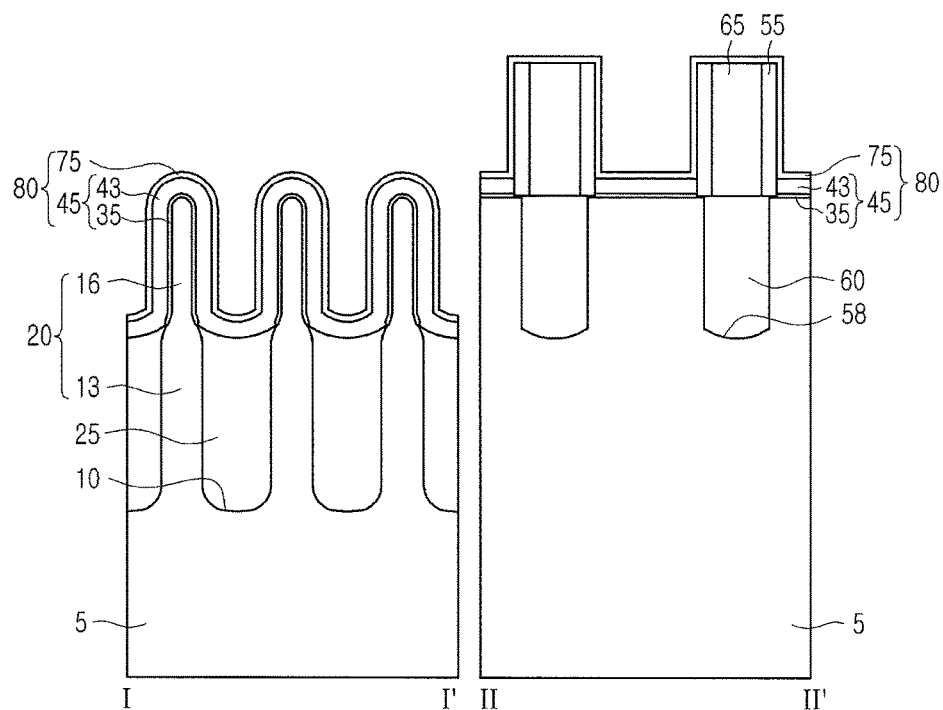

With reference to FIGS. 1 and 19, on a substrate having the gate trenches 70, a deposition process such as ALD or the like may be performed to conformally form a deposition oxide layer 75.

In some embodiments, the deposition oxide layer 75 may be formed of a high-k dielectric having a dielectric constant greater than that of the oxidation oxide layer 45 including the first oxidation oxide layer 35 and the second oxidation oxide layer 43. For example, the deposition oxide layer 75 may be formed of at least one of a Hf-based dielectric (for example, a hafnium oxide), an Al-based dielectric (for example, an aluminum oxide), or a La-based dielectric (for example, a lanthanum oxide), or combinations thereof.

The deposition oxide layer 75, the second oxidation oxide layer 43, and the first oxidation oxide layer 35 may form the gate dielectric structure 80.

In addition to FIG. 1, with reference to FIGS. 2A, 2B, and 2C, a gate conductive layer is formed on a substrate having the gate dielectric structure 80, and the gate conductive layer is planarized to form the gate electrode structure 85 inside the gate trench.

Next, with reference to FIGS. 20 and 21, processing steps in the fabrication of semiconductor devices according to some embodiments of the present inventive concept will be discussed.

Figure 20:
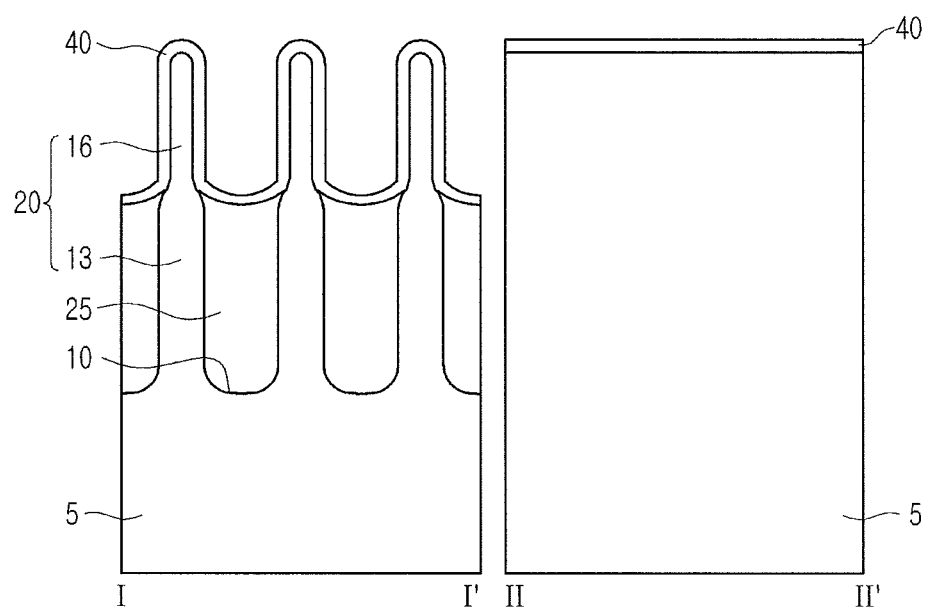
FIGS. 20 and 21 are cross-sections illustrating processing steps in the fabrication of semiconductor devices according to some embodiments of the present inventive concept.

With reference to FIG. 20, processes similar to those discussed with reference to FIGS. 11 and 12 may be performed to form the fin active region 20 and the isolation region 25, on the substrate 5. The fin active region 20 may include the body portion 13 passing through the isolation region 25 and the protruding portion 16 provided on the body portion 13.

Next, a deposition process is performed to conformally form the semiconductor layer 40, as illustrated in FIG. 14, on the fin active region 20 and the isolation region 25. The semiconductor layer 40 may be in contact with the protruding portion 16 of the fin active region 20.

Figure 21:
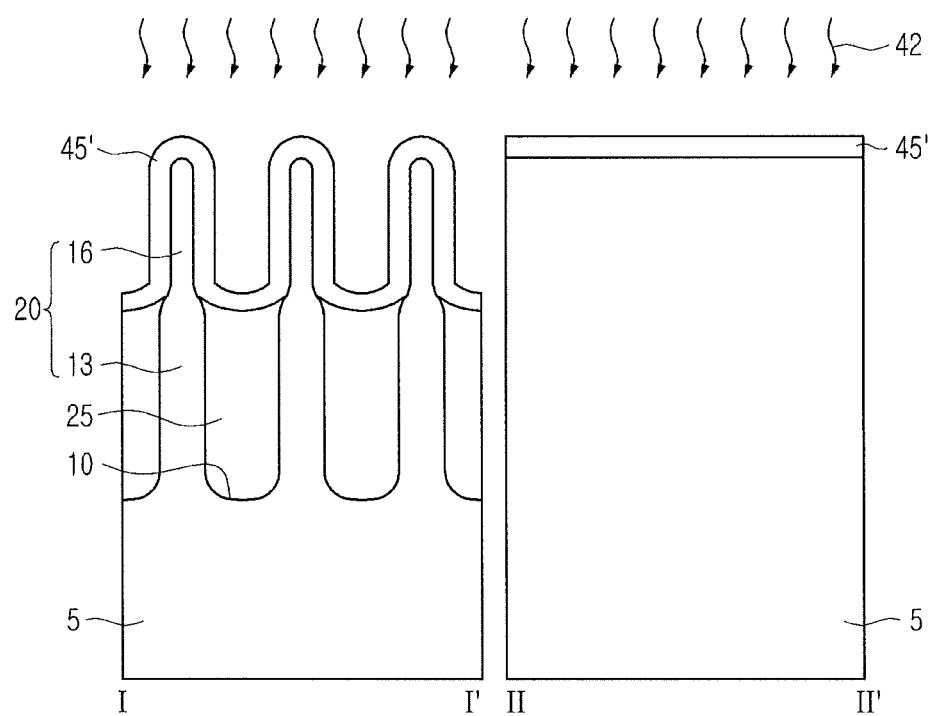

With reference to FIG. 21, an oxidation process the same as the second oxidation process 42 illustrated in FIG. 15 may be performed to oxidize the entirety of the semiconductor layer (40 in FIG. 20) to form the oxidation oxide layer 45'. Thus, the oxidation oxide layer 45' illustrated in FIGS. 3A and 3B may be formed.

Processes the same as those illustrated in FIGS. 16 to 19 may be performed to form the deposition oxide layer 75 on the oxidation oxide layer 45'.

Figure 22:
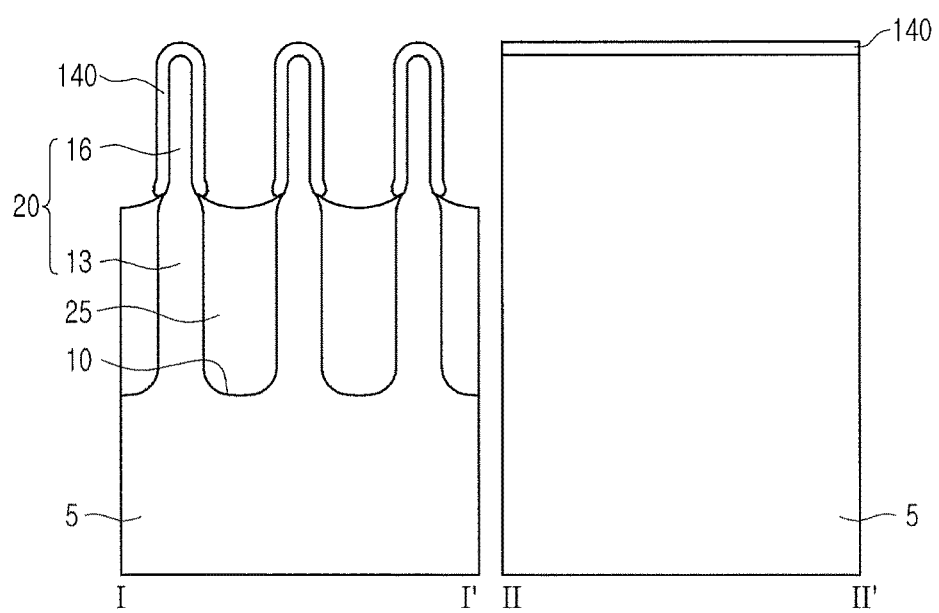
FIGS. 22 and 23 are cross-sections illustrating processing steps in the fabrication of semiconductor devices according to some embodiments of the present inventive concept.
Figure 23:
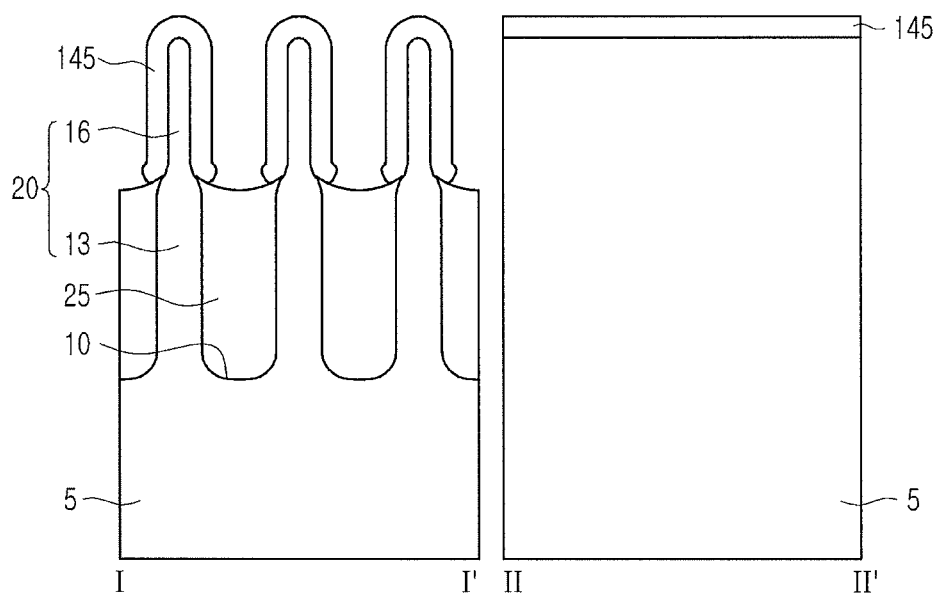

With reference to FIGS. 22 and 23, another example of a method of forming a semiconductor device according to an example embodiment will be discussed.

With reference to FIG. 22, processes the same as those discussed with reference to FIGS. 11 and 12 may be performed to form the fin active region 20 and the isolation region 25 on the substrate 5.

A selective epitaxial growth (SEG) process may be performed to allow a semiconductor layer 140 to be grown from the protruding portion 16 of the fin active region 20.

With reference to FIG. 23, an oxidation process the same as the second oxidation process 42 as illustrated in FIG. 15 may be performed to form an oxidation oxide layer 145 by oxidizing the semiconductor layer (140 in FIG. 22). Thus, the oxidation oxide layer 145 illustrated in FIGS. 4A and 4B may be formed.

Processes the same as those illustrated in FIGS. 16 to 19 may be performed to form the deposition oxide layer 175 provided on the oxidation oxide layer 145.

Figure 24:
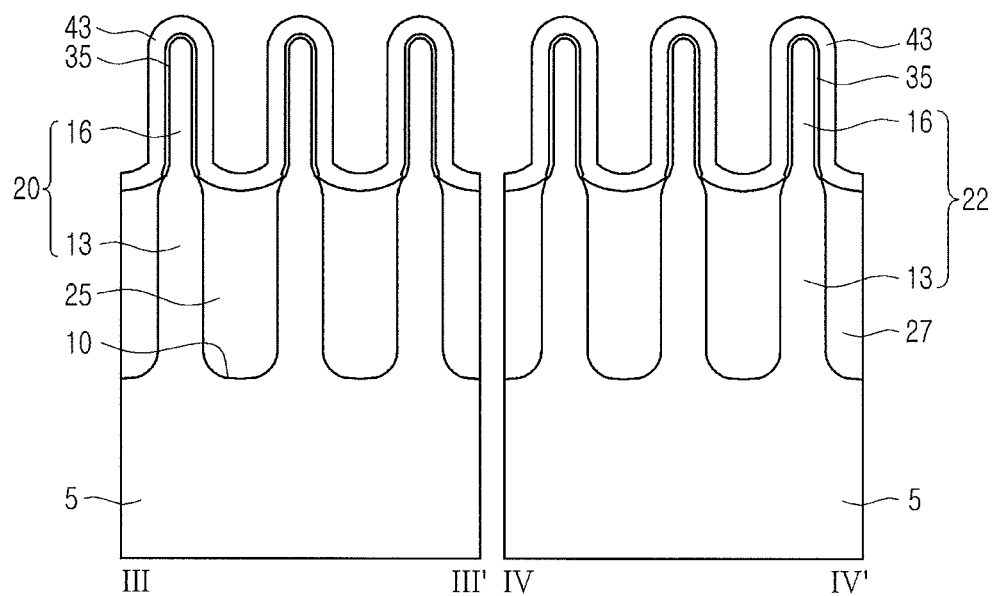
FIGS. 24 to 26 are cross-sections illustrating processing steps in the fabrication of semiconductor devices according to some embodiments of the present inventive concept.
Figure 25:
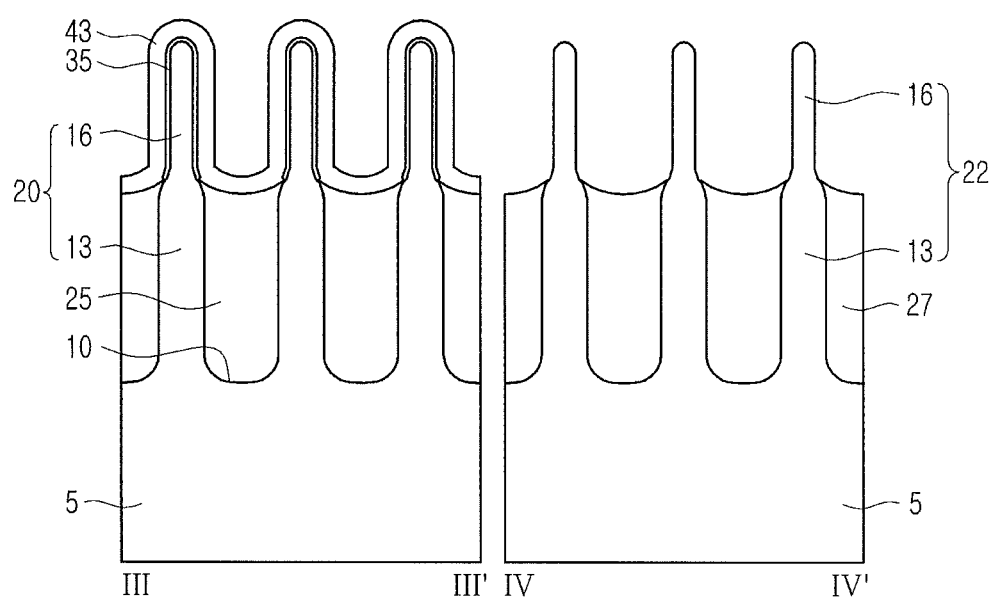
Figure 26:
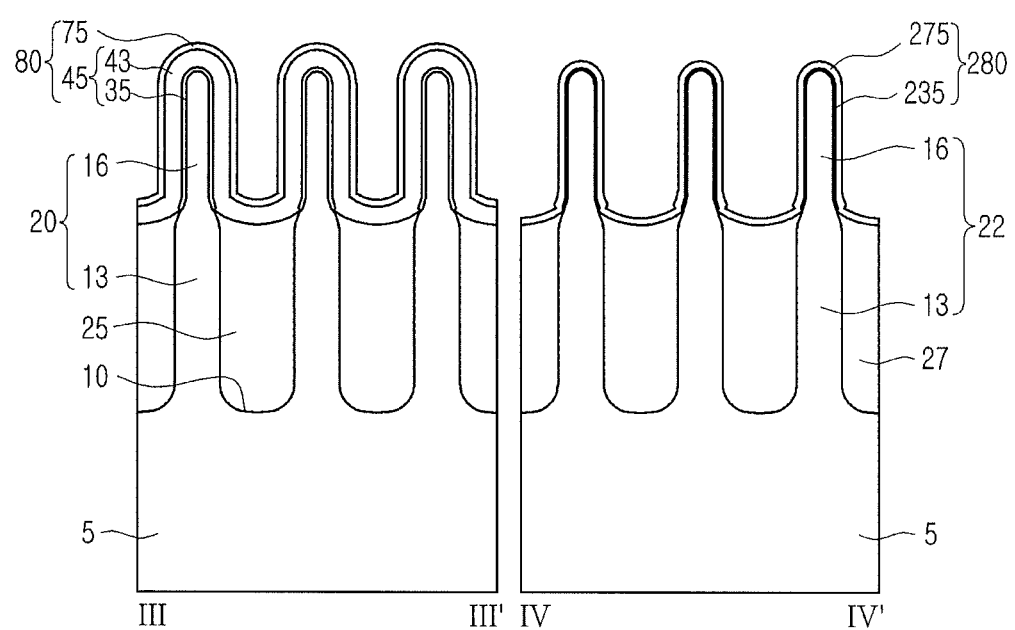

With reference to FIGS. 24 to 26, another example of a method of forming a semiconductor device according to an example embodiment will be discussed.

With reference to FIG. 24, the substrate 5 having the first circuit region 1a and the second circuit region 1b may be prepared. Processes the same as those discussed with reference to FIGS. 11 and 12 may be performed to form the first fin active region 20 and the first isolation region 25 provided on the substrate 5 of the first circuit region 1a, and to form the second fin active region 22 and the second isolation region 27 provided on the substrate 5 of the second circuit region 1b.

Processes the same as those illustrated in FIGS. 13 to 15 may be performed to form the first oxidation oxide layer 35 and the second oxidation oxide layer 43 illustrated in FIG. 15.

Processes the same as those illustrated in FIGS. 16 to 18 may be performed to form a first gate trench in the first circuit region 1a and to form a second gate trench in the second circuit region 1b.

With reference to FIG. 25, the first oxidation oxide layer 35 and the second oxidation oxide layer 43 of the first circuit region 1a may be selectively removed.

With reference to FIG. 26, the interfacial oxide layer 235 may be formed on a surface of the protruding portion 16 of the second fin active region 22 of the second circuit region 1b. The interfacial oxide layer 235 may be formed to have a thickness less than that of the second oxidation oxide layer 43.

While the first deposition oxide layer 75 is formed on the substrate 5 of the first circuit region 1a, the second deposition oxide layer 275 may be formed on the substrate 5 of the second circuit region 1b.

As set forth above, according to some embodiments of the present inventive concept, a semiconductor device including a gate dielectric structure improving reliability, may be provided. The gate dielectric structure may be adapted to form a FinFET. The gate dielectric structure may include an oxidation oxide layer formed by an oxidation process.

Forming the oxidation oxide layer may be performed by oxidizing a semiconductor layer after a semiconductor layer is formed on a fin active region. Thus, the oxidation oxide layer may be formed to have a desired thickness using a semiconductor layer formed by a separate process without consumption of a semiconductor element inside the fin active region.

As a result, without consumption of the fin active region, in other words, without a reduction in a width of the fin active region, an oxidation oxide layer having a quality higher than that of an oxide formed by a deposition process is formed to have a desired thickness, thereby improving reliability of the semiconductor device including a gate dielectric structure having the oxidation oxide layer.

While example embodiments have been shown and discussed above, it will be apparent to those skilled in the art that modifications and variations could be made without departing from the scope of the present disclosure as defined by the appended claims.

What is claimed is:

1. A semiconductor device comprising:
  a fin active region on a substrate, the fin active region including a lower region, a middle region on the lower region, and an upper region on the middle region, the middle region having lateral surfaces with a slope that is not as steep as that of lateral surfaces of the upper region;
  an isolation region on a lateral surface of the lower region of the fin active region;
  a gate electrode structure intersecting the fin active region and extended on the isolation region; and
    a gate dielectric structure including an oxidation oxide layer and a deposition oxide layer and having a thickness greater than half a width of the upper region of the fin active region,
    wherein the deposition oxide layer is between the gate electrode structure and the fin active region and between the gate electrode structure and the isolation region; and
    wherein the oxidation oxide layer is between the fin active region and the deposition oxide layer.

2. The semiconductor device of claim 1, wherein the deposition oxide layer comprises a high-k dielectric having a dielectric constant greater than that of the oxidation oxide layer.

3. The semiconductor device of claim 1, wherein the oxidation oxide layer has a thickness greater than half a width of the upper region of the fin active region.

4. The semiconductor device of claim 3, wherein the oxidation oxide layer has a thickness less than a width of the upper region of the fin active region.

5. The semiconductor device of claim 1, wherein the deposition oxide layer has a thickness less than that of the oxidation oxide layer.

6. The semiconductor device of claim 1:
  wherein the deposition oxide layer is extended to a lateral surface of the gate electrode structure; and
  wherein the oxidation oxide layer is not extended to the lateral surface of the gate electrode structure.

7. The semiconductor device of claim 1, wherein the oxidation oxide layer is extends between the deposition oxide layer and the isolation region.

8. The semiconductor device of claim 1:
  wherein the upper region has a width less than that of the middle region; and
  wherein the middle region has a width less than that of the lower region.

9. The semiconductor device of claim 1:
  wherein the middle region includes a first portion and a second portion adjacent to each other;
  wherein the first portion is close to the upper region and opposes the oxidation oxide layer;
  wherein the second portion is close to the lower region and opposes the isolation region; and
  wherein a lateral surface of the first portion is recessed as compared to a lateral surface of the second portion.

10. The semiconductor device of claim 1:
wherein the upper region has lateral surfaces opposing each other and disposed parallel to each other; and
  wherein the middle region has lateral surfaces opposing each other, while not being parallel to each other.

11. The semiconductor device of claim 1, wherein the deposition oxide layer has a thickness less than that of the oxidation oxide layer.

12. A semiconductor device comprising:
  a fin active region on a substrate, the fin active region including a lower region, a middle region on the lower region, and an upper region on the middle region;
  an isolation region on a lateral surface of the lower region of the fin active region; and
  a gate dielectric structure including an oxidation oxide layer and a deposition oxide layer and having a thickness greater than half a width of the upper region of the fin active region,
  wherein the deposition oxide layer is between a gate electrode structure and the fin active region and between the gate electrode structure and the isolation region; and
  wherein the oxidation oxide layer is between the fin active region and the deposition oxide layer.

13. The semiconductor device of claim 12, wherein the deposition oxide layer comprises a high-k dielectric having a dielectric constant greater than that of the oxidation oxide layer.

14. The semiconductor device of claim 12, wherein the oxidation oxide layer has a thickness greater than half a width of the upper region of the fin active region.

15. The semiconductor device of claim 14, wherein the oxidation oxide layer has a thickness less than a width of the upper region of the fin active region.

* * * * *